(12) United States Patent
Dahlstrom et al.

(10) Patent No.: US 9,564,508 B2
(45) Date of Patent: Feb. 7, 2017

(54) DEVICE ISOLATION WITH IMPROVED THERMAL CONDUCTIVITY

(71) Applicant: INTERNATIONAL BUSINESS MACHINES CORPORATION, Armonk, NY (US)

(72) Inventors: Mattias E. Dahlstrom, Los Alto, CA (US); Dinh Dang, Essex Junction, VT (US); Qizhi Liu, Lexington, MA (US); Ramana M. Malladi, Williston, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 156 days.

(21) Appl. No.: 14/528,435

(22) Filed: Oct. 30, 2014

(65) Prior Publication Data

US 2015/0056777 A1    Feb. 26, 2015

Related U.S. Application Data

(62) Division of application No. 12/967,771, filed on Dec. 14, 2010, now Pat. No. 8,912,574.

(51) Int. Cl.
| | |
|---|---|
| *H01L 29/66* | (2006.01) |
| *H01L 21/762* | (2006.01) |
| *H01L 21/763* | (2006.01) |
| *H01L 23/367* | (2006.01) |
| *H01L 29/08* | (2006.01) |
| *H01L 29/737* | (2006.01) |
| *H01L 21/306* | (2006.01) |

(Continued)

(52) U.S. Cl.
CPC ....... *H01L 29/66242* (2013.01); *H01L 21/308* (2013.01); *H01L 21/30604* (2013.01); *H01L 21/763* (2013.01); *H01L 21/76224* (2013.01); *H01L 23/367* (2013.01); *H01L 23/3677* (2013.01); *H01L 23/373* (2013.01); *H01L 29/0821* (2013.01); *H01L 29/7371* (2013.01); *H01L 2924/0002* (2013.01)

(58) Field of Classification Search
CPC .................. H01L 2924/0002; H01L 21/76224; H01L 2924/00; H01L 29/66825; H01L 21/743; H01L 21/76898; H01L 21/823871; H01L 21/823878; H01L 21/823892; H01L 23/481; H01L 27/0262; H01L 27/092; H01L 27/0921
USPC .......... 257/E21.422, E21.546, 315, E21.09,257/E21.35, E21.371, E21.388, E21.682,257/E21.704, E27.062, E27.103, E29.001,257/E29.002, E29.193, E29.211, E29.306, 107,257/198, 2, 3, 317, 318, 321, 330, 372, 4, 401,257/5, 538, 565, 587, 591; 438/424, 102, 103, 438/133, 309, 312, 320, 350, 381
See application file for complete search history.

(56) References Cited

U.S. PATENT DOCUMENTS

| | | | |
|---|---|---|---|
| 6,100,199 A | 8/2000 | Joshi et al. | |
| 6,110,877 A * | 8/2000 | Roberts | .............. C10M 169/044 508/363 |

(Continued)

FOREIGN PATENT DOCUMENTS

WO    2009109235 A1    9/2009

*Primary Examiner* — William F Kraig
*Assistant Examiner* — Edward Chin
(74) *Attorney, Agent, or Firm* — David Cain; Andrew M. Calderon; Roberts Mlotkowski Safran Cole & Calderon, P.C.

(57) ABSTRACT

A method of making a semiconductor structure includes forming a trench through a shallow trench isolation (STI) structure and into a substrate, and forming a liner including (Continued)

an electrical insulator material on sidewalls of the trench. The method also includes forming a core including a high thermal conductivity material in the trench and on the liner, and forming a cap in the trench and on the core.

18 Claims, 7 Drawing Sheets

(51) Int. Cl.
*H01L 21/308* (2006.01)
*H01L 23/373* (2006.01)

(56) References Cited

U.S. PATENT DOCUMENTS

| | | | |
|---|---|---|---|
| 6,459,142 B1 | 10/2002 | Tihanyi | |
| 6,573,565 B2 | 6/2003 | Clevenger et al. | |
| 6,586,818 B1 | 7/2003 | Voldman | |
| 6,756,257 B2 | 6/2004 | Davari et al. | |
| 6,773,952 B2 | 8/2004 | Armbrust et al. | |
| 6,784,075 B2 * | 8/2004 | Ku | H01L 21/76224 |
| | | | 257/E21.546 |
| 7,033,927 B2 | 4/2006 | Cohen et al. | |
| 7,052,937 B2 | 5/2006 | Clevenger et al. | |
| 7,057,231 B2 * | 6/2006 | Ding | H01L 27/115 |
| | | | 257/315 |
| 7,129,540 B2 * | 10/2006 | Gratz | H01L 29/402 |
| | | | 257/315 |
| 7,465,969 B2 * | 12/2008 | Ohnishi | H01L 29/7378 |
| | | | 257/198 |
| 7,554,148 B2 | 6/2009 | Su et al. | |
| 7,651,897 B2 | 1/2010 | Vashchenko et al. | |
| 7,781,292 B2 | 8/2010 | Gambino et al. | |
| 7,955,940 B2 | 6/2011 | Dyer et al. | |
| 8,105,924 B2 | 1/2012 | Orner et al. | |
| 8,173,987 B2 * | 5/2012 | Lung | G11C 13/0004 |
| | | | 257/2 |
| 8,193,563 B2 | 6/2012 | Gambino et al. | |
| 8,513,107 B2 | 8/2013 | Chan et al. | |
| 9,105,759 B2 * | 8/2015 | Chou | H01L 28/92 |
| 9,123,738 B1 * | 9/2015 | Mahoney | H01L 23/66 |
| 9,136,319 B2 * | 9/2015 | Richter | H01L 28/90 |
| 9,240,347 B2 * | 1/2016 | Chandrashekar | H01L 21/76876 |
| 2004/0222497 A1 | 11/2004 | Dunn et al. | |
| 2005/0224852 A1 * | 10/2005 | Cheng | H01L 27/10867 |
| | | | 257/296 |
| 2005/0230775 A1 | 10/2005 | Watanabe et al. | |
| 2006/0113639 A1 * | 6/2006 | Sutardja | B82Y 10/00 |
| | | | 257/634 |
| 2007/0051980 A1 | 3/2007 | Hodge et al. | |
| 2008/0044988 A1 * | 2/2008 | Zundel | H01L 21/268 |
| | | | 438/514 |
| 2008/0122031 A1 * | 5/2008 | DeNatale | H01G 4/005 |
| | | | 257/532 |
| 2008/0258268 A1 * | 10/2008 | Cheng | H01L 21/84 |
| | | | 257/622 |
| 2008/0308837 A1 * | 12/2008 | Gauthier, Jr. | H01L 27/0262 |
| | | | 257/107 |
| 2009/0257169 A1 * | 10/2009 | Chen | H01L 28/90 |
| | | | 361/301.4 |
| 2009/0302480 A1 * | 12/2009 | Birner | H01L 21/76898 |
| | | | 257/774 |
| 2010/0032767 A1 * | 2/2010 | Chapman | H01L 21/743 |
| | | | 257/372 |
| 2010/0155846 A1 * | 6/2010 | Mukherjee | H01L 21/28512 |
| | | | 257/365 |
| 2011/0003457 A1 | 1/2011 | Schuler et al. | |
| 2011/0079827 A1 | 4/2011 | Ellis-Monaghan et al. | |
| 2011/0193149 A1 | 8/2011 | Dyer et al. | |
| 2011/0269289 A1 | 11/2011 | Meunier-Beillard et al. | |
| 2012/0061798 A1 * | 3/2012 | Wong | H01L 27/10861 |
| | | | 257/532 |
| 2013/0087841 A1 * | 4/2013 | Basker | H01L 29/66181 |
| | | | 257/303 |
| 2013/0277803 A1 * | 10/2013 | Pagani | H01L 23/5223 |
| | | | 257/532 |
| 2014/0183691 A1 * | 7/2014 | Saraswat | H01L 23/481 |
| | | | 257/531 |
| 2015/0076657 A1 * | 3/2015 | Chou | H01L 29/66181 |
| | | | 257/532 |
| 2016/0163711 A1 * | 6/2016 | Arndt | H01L 27/1087 |
| | | | 438/387 |

\* cited by examiner

US 9,564,508 B2

DEVICE ISOLATION WITH IMPROVED THERMAL CONDUCTIVITY

FIELD OF THE INVENTION

The invention relates to semiconductor structures and methods of manufacture and, more particularly, to device isolation structures having improved thermal conductivity and methods of manufacture.

BACKGROUND

A typical bipolar transistor comprises a vertical stack of layers of semiconductor material of alternating conduction type, i.e., NPN or PNP. Normally, the collector is located at the bottom of the stack with the base sandwiched between the collector and the emitter. Forward biasing the base to emitter junction causes current to flow through that junction. Current through the base to emitter junction causes a much larger current to flow between the collector and emitter.

Silicon Germanium (SiGe) heterojunction bipolar transistors (HBTs) have found widespread use in high speed applications and, especially in Radio Frequency (RF) applications, high speed wired data transmission, test equipment, and wireless applications. These transistors are commonly used in semiconductor devices for high-speed operation and large drive current applications. Such heterojunction bipolar transistors are increasingly being used for applications in extremely high frequency range technologies such as communications and satellite circuitry.

In advanced SiGe HBTs, as current density increases and devices are scaling down in size and geometry, electrical isolation and heat dissipation are becoming increasingly significant design considerations. Conventional isolation structures including deep trench (DT) and trench isolation (TI) are inadequate for transferring sufficient heat away from the HBT.

Accordingly, there exists a need in the art to overcome the deficiencies and limitations described hereinabove.

SUMMARY

In a first aspect of the invention, there is a method of making a semiconductor structure. The method includes forming a trench through a shallow trench isolation (STI) structure and into a substrate, and forming a liner including an electrical insulator material on sidewalls of the trench. The method also includes forming a core including a high thermal conductivity material in the trench and on the liner, and forming a cap in the trench and on the core.

In another aspect of the invention, there is a method of making a semiconductor structure that comprises forming first and second shallow trench isolation (STI) structures in a wafer comprising a substrate, and forming a heterojunction bipolar transistor (HBT) comprising a collector, a base, and an emitter between the first and second STI structures. The method also comprises forming an insulator layer over the HBT and the first and second STI structures, and forming first and second trench isolation (TI) structures through the first and second STI structures, respectively, and into the substrate. The first and second TI structures are each filled with an insulator liner and a core composed of high thermal conductivity material.

In another aspect of the invention, there is a semiconductor structure comprising: a transistor structure; a plurality of shallow trench isolation structures adjacent to the transistor structure on multiple sides of the transistor structure; and a plurality of trench isolation structures formed through the plurality of shallow trench isolation structures. Each one of the plurality of trench isolation structures comprises: a trench formed through an insulator layer, one of the plurality of shallow trench isolation structures, and into a substrate; a liner comprising an insulator material on sidewalls of the trench; and a core comprising a high thermal conductivity material on the liner.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an isolation structure having improved thermal conductivity, which comprises the structures of the present invention. In still further embodiments, a method in a computer-aided design system is provided for generating a functional design model of the isolation structure having improved thermal conductivity. The method comprises generating a functional representation of the structural elements of the isolation structure having improved thermal conductivity.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to device isolation structures having improved thermal conductivity and methods of manufacture. In accordance with aspects of the invention, electrical isolation structures are filled with high thermal conductivity materials to improve heat dissipation characteristics of an integrated circuit chip. In embodiments, a trench isolation (TI) is formed during middle of the line (MEOL) processing (e.g., after forming an HBT device and prior to forming electrical contacts above the HBT device), and the TI is filled with a high thermal conductivity material. In additional embodiments, the TI is provided with a liner comprising an electrical insulator material, and a core of the TI comprises the high thermal conductivity material. The use of a high thermal conductivity material in the TI reduces the thermal resistance of the TI, which provides enhanced heat transfer associated with the TI. By forming the TI during middle of the line (MEOL) processing, the TI depth may be easily adjusted and different liner and/or high thermal conductivity materials may be introduced relatively risk-free. In this manner, implementations of the invention provide isolation structures having improved thermal conductivity for advanced SiGe BiCMOS.

Figure 1:
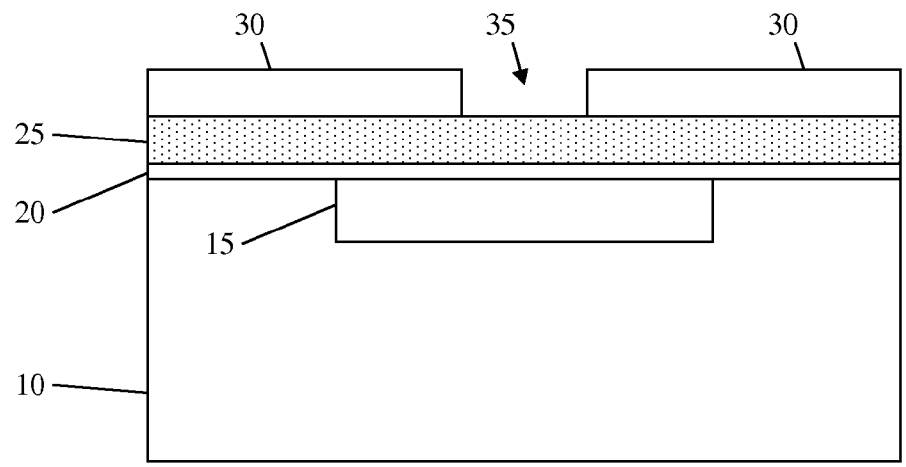
FIGS. 1-8 show semiconductor structures and processing steps for forming a trench isolation (TI) associated with aspects of the invention.

FIGS. 1-8 show structures and processing steps for forming a trench isolation (TI) in accordance with aspects of the invention. In particular, FIG. 1 shows a portion of a semiconductor wafer comprising a substrate 10 and shallow trench isolation (STI) 15 formed in the substrate 10. The substrate 10 may comprise any conventional semiconductor substrate such as, for example, a bulk silicon substrate or an active layer of semiconductor material of a silicon-on-insulator (SOI) wafer. The STI 15 may be a conventional shallow trench isolation structure formed using conventional semiconductor fabrication processes and materials. For example, the STI 15 may be formed by forming a photoresist material on the substrate 10, exposing and developing the photoresist, etching an STI trench in the substrate through the patterned photoresist, stripping the photoresist, filling the trench with an STI material (e.g., $SiO_2$), and planarizing the top surface of the structure (e.g., via chemical mechanical polish (CMP)).

Still referring to FIG. 1, the structure may include a barrier layer 20 formed over the STI 15. The barrier layer 20 may comprise any suitable barrier layer material, such as, for example, nitride, oxynitride, etc. The barrier layer 20 may also cover portions of the substrate 10 and devices (e.g., transistors, etc.) formed in the substrate 10.

As additionally shown in FIG. 1, the structure may comprise an insulator layer 25. The insulator layer 25 may be composed of any suitable insulator material, such as silicon dioxide ($SiO_2$), borophosphosilicate glass (BPSG), etc. In embodiments, the insulator layer 25 comprises a interlevel dielectric (ILD) layer composed of BPSG in which contacts are formed to provide electrical connection to one or more devices (e.g., transistors, resistors, capacitors, etc.) formed in and/or on the substrate 10. Also shown in FIG. 1, a layer of photoresist 30 is formed on the insulator layer 25 and patterned (e.g., exposed and developed) to form an opening 35.

Figure 2:
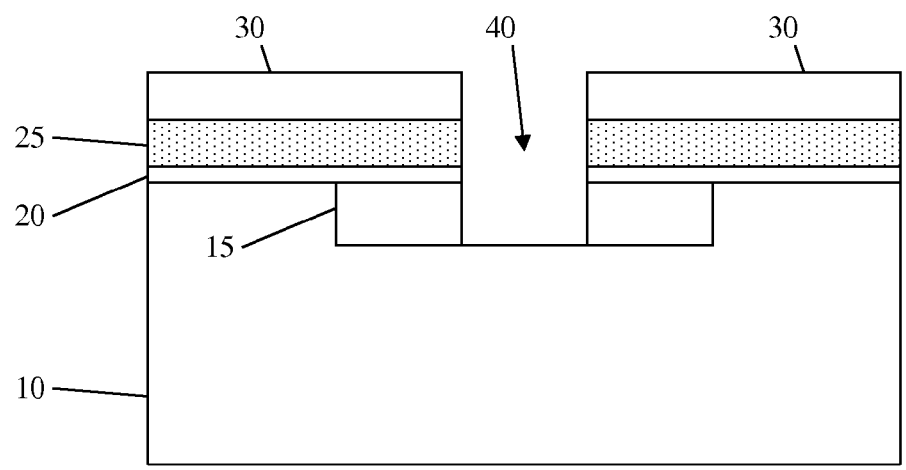

As depicted in FIG. 2, a trench 40 is formed in the insulator layer 25, barrier layer 20, and STI 15. In embodiments, the trench 40 is formed by etching the insulator layer 25, barrier layer 20, and STI 15 through the opening 35 in the photoresist 30. One or more conventional etch processes, such as a reactive ion etch (RIE), may be used to form the trench 40. For example, a respective RIE process may be performed for etching each of the insulator layer 25, barrier layer 20, and STI 15, with each respective RIE process being tailored to the material of the feature being etched.

Figure 3:
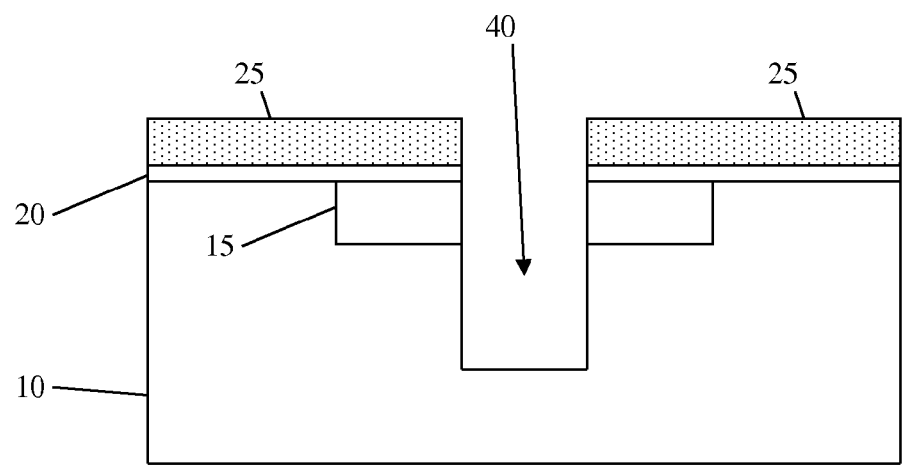

FIG. 3 shows that the trench 40 is extended into the substrate 10. In embodiments, the photoresist 30 is stripped (e.g., using an HF stripping process) and the insulator layer 25 is used as a hard mask for etching the trench 40 in the substrate 10. Any suitable etch may be used to form the trench 40 in the substrate 10, such as a selective RIE process. In embodiments, the trench 40 has a width of about 0.5 μm to about 1.5 μm and a depth of about 2 μm to about 6.0 μm from a top of the insulator layer 25 to a base of the trench 40 in the substrate 10. The invention is not limited to these exemplary dimensions, however, and any suitable width and depth may be used with the trench 40 within the scope of the invention.

Figure 4:
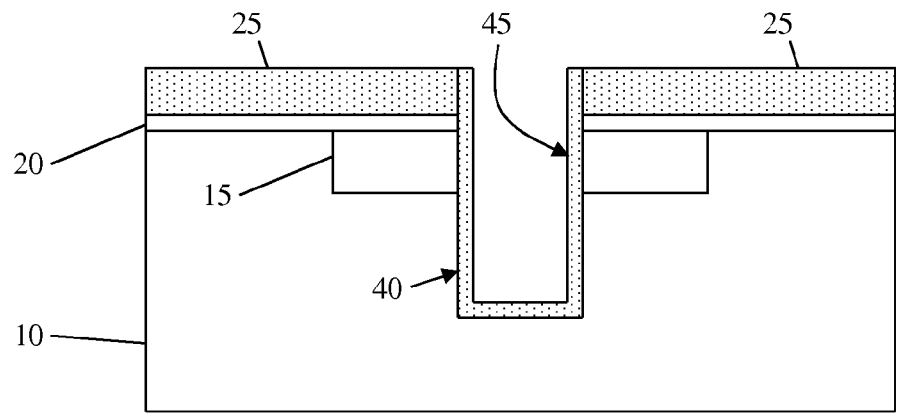

As shown in FIG. 4, a liner 45 comprising an electrical insulator material is formed on the exposed surfaces of the trench 40. The liner 45 may be formed using conventional semiconductor processes and any suitable insulator material. In embodiments, the liner 45 is formed using a conformal deposition process, such as chemical vapor deposition (CVD), and is composed of a same material as the insulator layer 25, e.g., BPSG. The liner 45 may be formed to any desired thickness sufficient to provide electrical isolation. For example, the liner 45 may have a thickness of about 300 Å, although other thicknesses may be used within the scope of the invention to the extent that the liner does not pinch off the opening of the trench.

Figure 5:
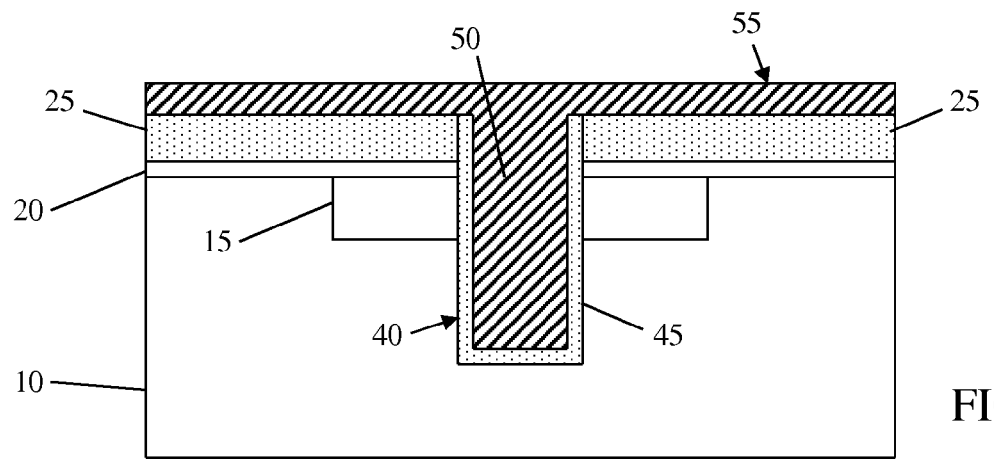

As depicted in FIG. 5, a core 50 is formed in the trench 40 on the liner 45. In accordance with aspects of the invention, the core 50 comprises a high thermal conductivity material including, but not limited to, polysilicon, tungsten, copper, aluminum, silver, gold, and combinations thereof. In embodiments, the core 50 is composed of polysilicon and is formed using a CVD process, although other high thermal conductivity materials may be provided using other formation processes. More specifically, according to aspects of the invention, the core 50 is composed of any suitable material that has a thermal conductivity that is substantially greater than the thermal conductivity of glass. Table 1 shows the thermal conductivity of various materials.

TABLE 1

| Material | Thermal Conductivity (w/m · K) |
|---|---|
| Air | 0.025 |
| Water (liquid) | 0.6 |
| Glass | 1.1 |
| Silicon | 149 |
| Tungsten | 173 |
| Aluminum (pure) | 237 |
| Gold | 318 |
| Copper | 401 |
| Silver | 429 |
| Diamond | 900-2320 |
| Graphene | 4840-5300 |

As is evident from Table 1, polysilicon, tungsten, copper, aluminum, silver, and gold each has a thermal conductivity substantially greater than that of glass, and thus may be considered as high thermal conductivity materials. The high thermal conductivity material of the core 50 may also comprise a phase change material, such as indium-antimony (InSb), with an alloy composition that melts at about 100° C. Such as change material will absorb heat (e.g., latent heat) when it melts, e.g., changes phase from solid to liquid. Silicon dioxide ($SiO_2$) and BPSG are commonly used as the sole fill material in a TI structure. These materials (e.g., $SiO_2$ and BPSG) have a thermal conductivity similar to that of glass, and therefore are not high thermal conductivity materials.

Figure 6:
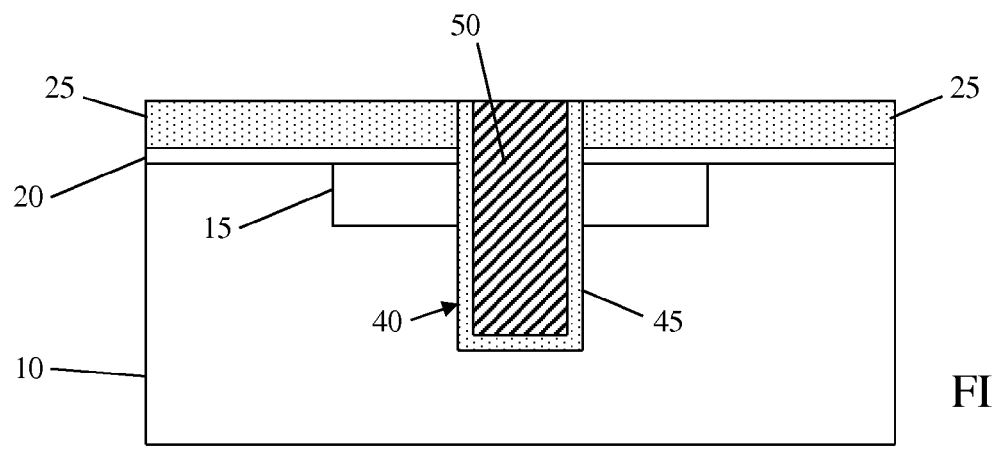

Still referring to FIG. 5, the deposition of the core 50 may result in the formation of excess material 55 on the upper surface of the insulator layer 25. As shown in FIG. 6, the excess material (e.g., polysilicon) is removed using a planarization process. Any suitable planarization process may be used, such as an etch or CMP process. In embodiments, the structure is planarized using an endpoint etch that removes the excess material (e.g., polysilicon) from the top surface of the insulator layer 25.

Figure 7:
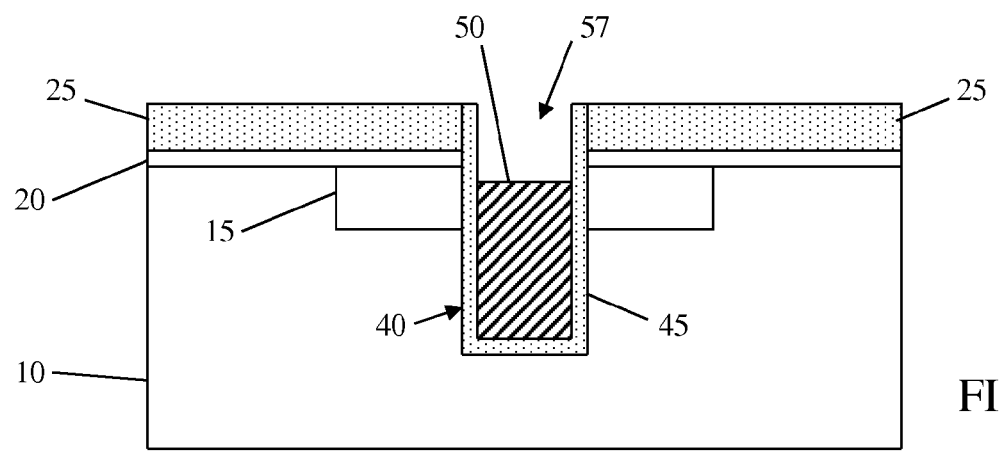

As depicted in FIG. 7, the core 50 is recessed to form a trench 57. The trench 57 may be formed using any suitable technique, such as a timed etch of the core 50 material. In exemplary embodiments, the insulator layer 25 is composed of BPSG, the core is composed of polysilicon, and the endpoint etch described in FIG. 6 and the timed etch described in FIG. 7 are both RIE processes that stop on BPSG.

Figure 8:
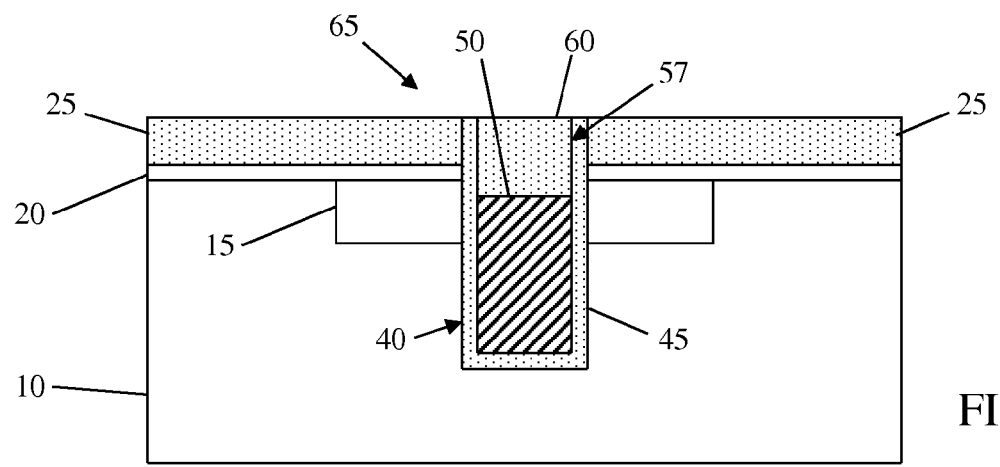

In accordance with aspects of the invention, as shown in FIG. 8, a cap 60 comprising an insulator material is formed in the trench 57. In embodiments, the cap 60 is composed of the same material as the liner 45 and the insulator layer 25, e.g., BPSG, although other insulator materials may be used within the scope of the invention. The cap 60 may be formed using any desired fabrication technique, such as CVD. A planarization process, e.g., CMP, may be performed after forming the cap 60, followed by back end of line (BEOL) processing, such as forming electrical contacts in the insulator layer 25. According to aspects of the invention, the liner 45, core 50, and cap 60 constitute a trench isolation (TI) 65. The TI 65 provides electrical isolation due to the liner 45 composed of insulator material, and also provides enhanced thermal dissipation due to the core 50 composed of high thermal conductivity material.

Figure 9:
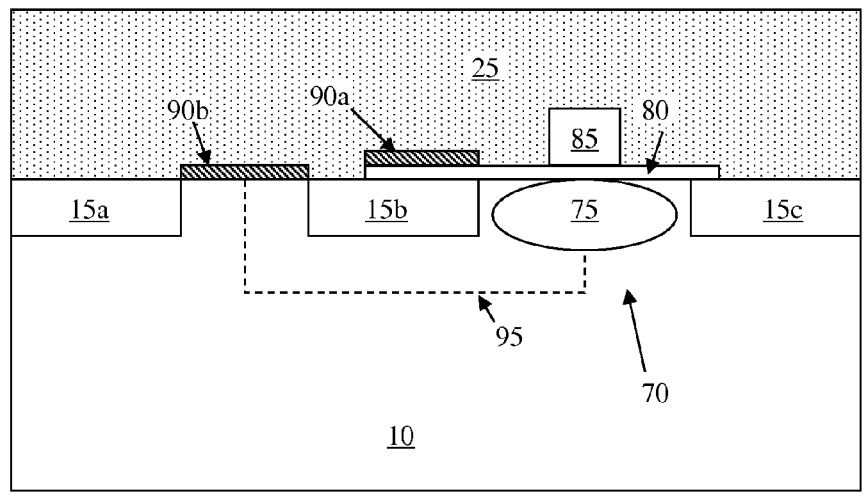
FIGS. 9-12 show semiconductor structures and processing steps for forming trench isolations (TIs) around an HBT in accordance with aspects of the invention.

FIGS. 9-13 depict semiconductor structures and processing steps for forming trench isolations (TIs) around an HBT in accordance with aspects of the invention. In particular, FIG. 9 shows a semiconductor structure comprising an HBT 70 formed in and on a substrate 10. The substrate 10 also includes STIs 15a, 15b, and 15c. The substrate 10 and STIs 15a-c may be the same as substrate 10 and STI 15 described above with respect to FIG. 1.

In embodiments, the HBT 70 comprises a collector 75 formed in the substrate 10, a base 80 formed over the collector 75, and an emitter 85 formed over the base 80. The HBT 70 may be any suitable HBT, such as a self-aligned SiGe HBT. The HBT 70 may be one of a number of such HBTs connected to other devices in an integrated circuit (IC) chip, e.g., on a BiCMOS IC chip. In implementations, the collector 75 is formed between two STIs 15b and 15c, a base silicide 90a is formed over the STI 15b, and a collector silicide 90b is formed over the substrate 10 between the two STIs 15a and 15b. A subcollector/reachthrough 95 may be formed in the substrate and is diagrammatically shown connecting the collector 75 and the collector silicide 90b.

Still referring to FIG. 9, an insulator layer 25 covers the substrate 10, STIs 15a-c, and the HBT 70. The insulator layer 25 may be the same as insulator layer 25 described above with respect to FIG. 1 and may be composed of, for example, BPSG deposited using CVD. The structure shown in FIG. 9 may be formed using conventional semiconductor fabrication processes and materials.

Figure 10:
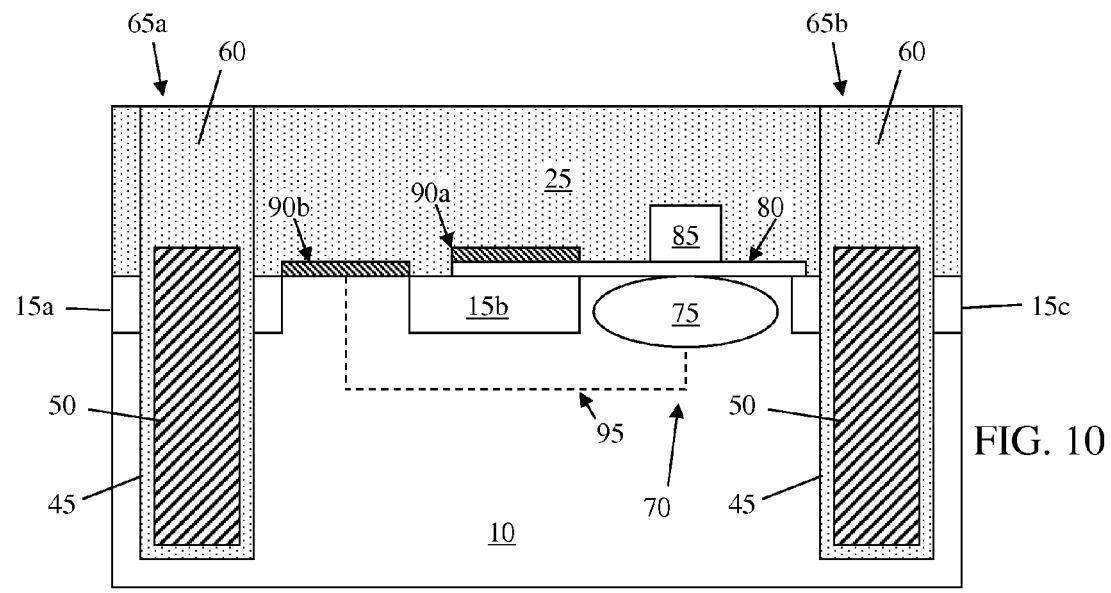

In accordance with aspects of the invention, as depicted in FIG. 10, two TIs 65a and 65b are formed through the STIs 15a and 15c and extending into the substrate 10. The TIs 65a and 65b may be formed in a similar manner as TI 65 described with respect to FIGS. 1-8, and may each comprise a liner 45 composed of insulator material (e.g., BPSG), core 50 composed of high thermal conductivity material (e.g., polysilicon), and cap 60 composed of insulator material (e.g., BPSG).

The TIs 65a and 65b provide electrical isolation for the HBT 70 due to the insulator liners 45 being formed adjacent to and on plural sides of the HBT 70. The TIs 65a and 65 also provide enhanced heat dissipation for the HBT 70 due to the core 50 composed of high thermal conductivity material that has a relatively low thermal resistance.

In embodiments, a top surface of the core 50 is at or above the top level of the silicon material of the substrate 10. This aids in transferring heat away from the region between the base 80 and the collector 75, where most of the heat is generated in the HBT 70. The invention is not limited to this configuration, however, and the top surface of the core 50 may be located at any desired height relative to the region between the base 80 and the collector 75.

Figure 11:
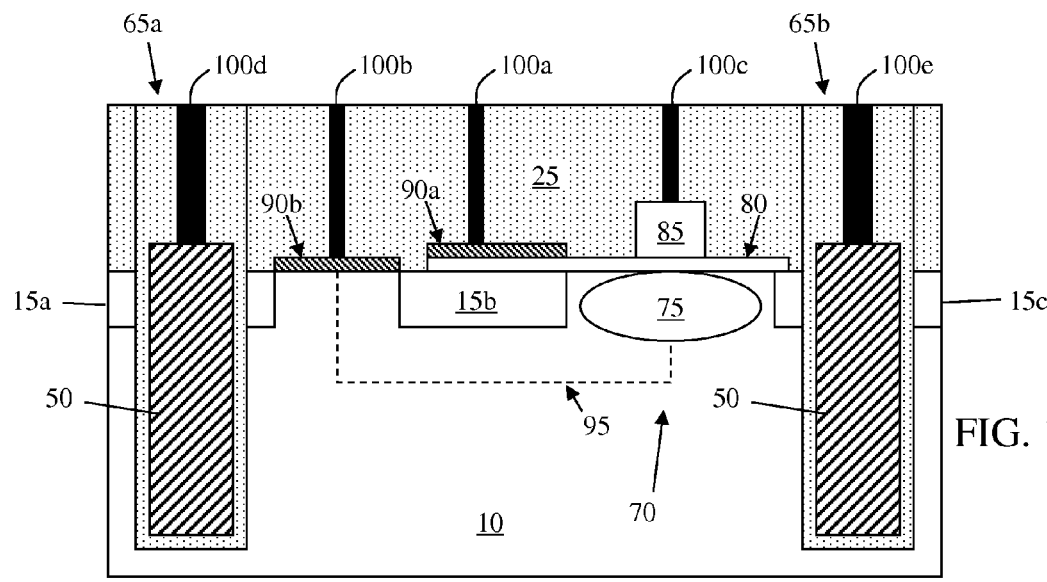

As depicted in FIG. 11, contacts 100a-c are formed in the insulator layer 25 to provide electrical connections to the collector 75, base 80, and emitter 85. The contacts 100a-c may be formed in any desired manner, such as masking the insulator layer 25, etching trenches in the insulator layer 25, and filling the trenches with an electrically conductive material (e.g., tungsten, etc.).

Still referring to FIG. 11, in embodiments, TI contacts 100d and 100e may be formed in the insulator layer 25 and in contact with the core 50. The TI contacts 100d and 100e may be formed in the same processing steps as contacts 100a-c and may be composed of the same material as contacts 100a-c. In accordance with aspects of the invention, the TI contacts 100d and 100e provide a low thermal resistance heat flow path upward from the HBT 70 (e.g., to additional layers of the chip), in addition to the downward heat flow path provided by the core 50 (e.g., into the substrate 10).

Figure 12:
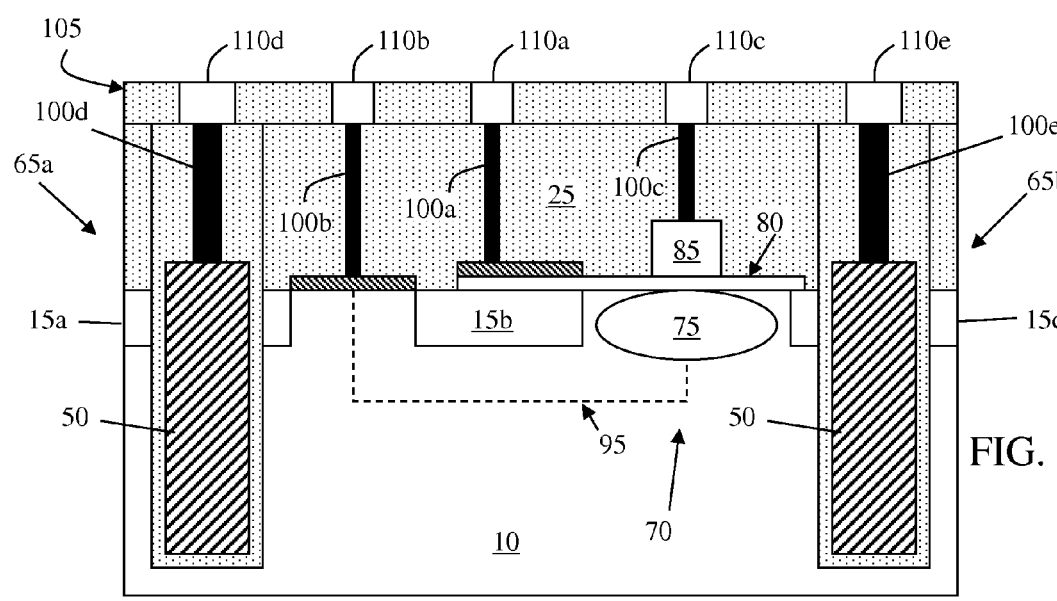

As shown in FIG. 12, an ILD layer 105 may be formed over the insulator layer 25, and wires/interconnects 110a-c may be formed in the ILD layer 105. The ILD layer 105 and wires 110a-c may be formed using conventional semiconductor fabrication processes and materials. For example, the ILD layer 105 may be composed of undoped silicate glass (USG), fluorosilicate glass (FSG), and/or other low-K dielectric materials, etc., and the wires 110a-c may comprise Cu. The wires 110a-c provide electrical connections to the respective contacts 100a-c.

In accordance with aspects of the invention, dummy wires 110d and 110e may be formed in contact with TI contacts 100d and 100e. In embodiments, the dummy wires 110d and 110e are not electrically connected to other devices (e.g., transistors, capacitors, resistors, etc.) and extend to other areas of the chip for carrying heat away from the HBT 70. The dummy wires 110d and 110e may also function as an electromagnetic (EM) shield. The dummy wires 110 may be formed in the same processing steps as wires 110a-c and may be composed of the same material as wires 110a-c. The TI contacts 100d and 100e and dummy wires 110d and 110e are optional, and the invention may be implemented without these features.

Figure 13:
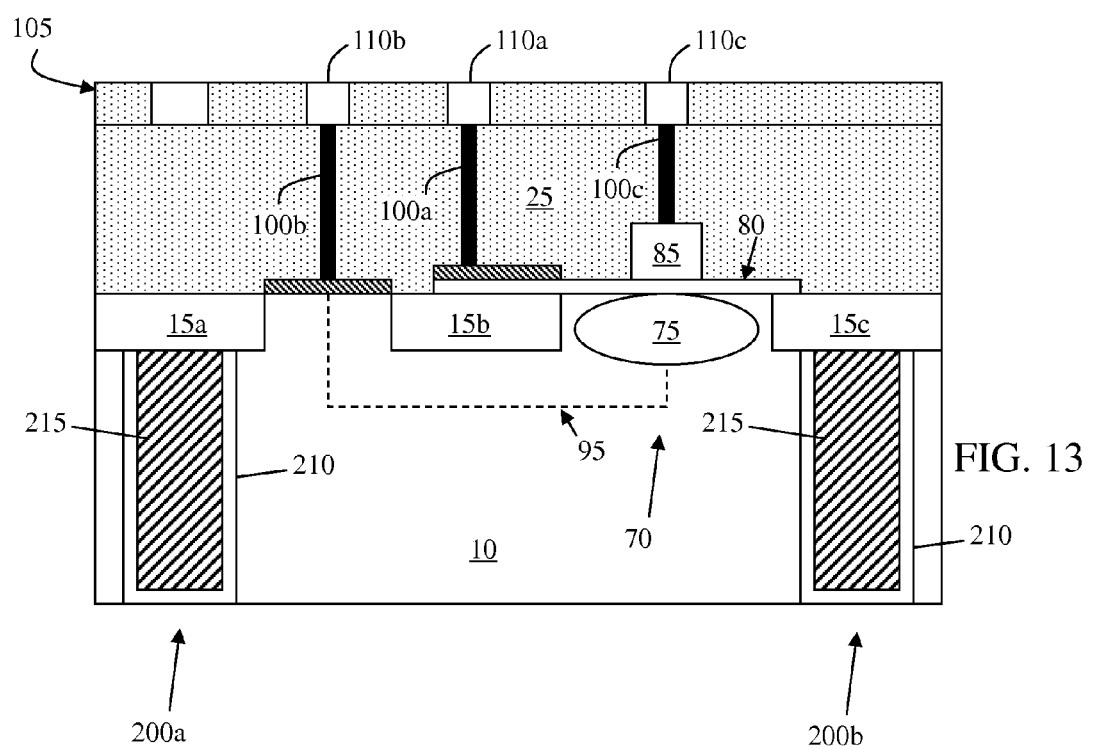
FIG. 13 shows deep trench (DT) isolation structures in accordance with aspects of the invention.

FIG. 13 shows deep trench (DT) isolation structures 200a and 200b in accordance with aspects of the invention. In embodiments, the DTs 200a and 200b comprise a liner 210 and a core 215. The liner 210 may comprise a layer of oxide having a thickness of about 150 Å and a layer of TEOS (tetraethylorthosilicate) having a thickness of about 300 Å. Alternatively, the layer of oxide may be omitted, and the liner 210 may comprise only the layer of TEOS having a thickness of about 300 Å. In embodiments, the core 215 comprises a high thermal conductivity material, such as polysilicon. In contrast to the TIs described above (e.g., TI 65), the DTs 200a and 200b are formed in a substrate 10 prior to the formation of the STIs 15a-c and HBT 70. Additionally, the DTs 200a and 200b have a depth of about 5.0 μm to about 7.5 μm, which is substantially greater than the depth of the TIs 65.

Figure 14:
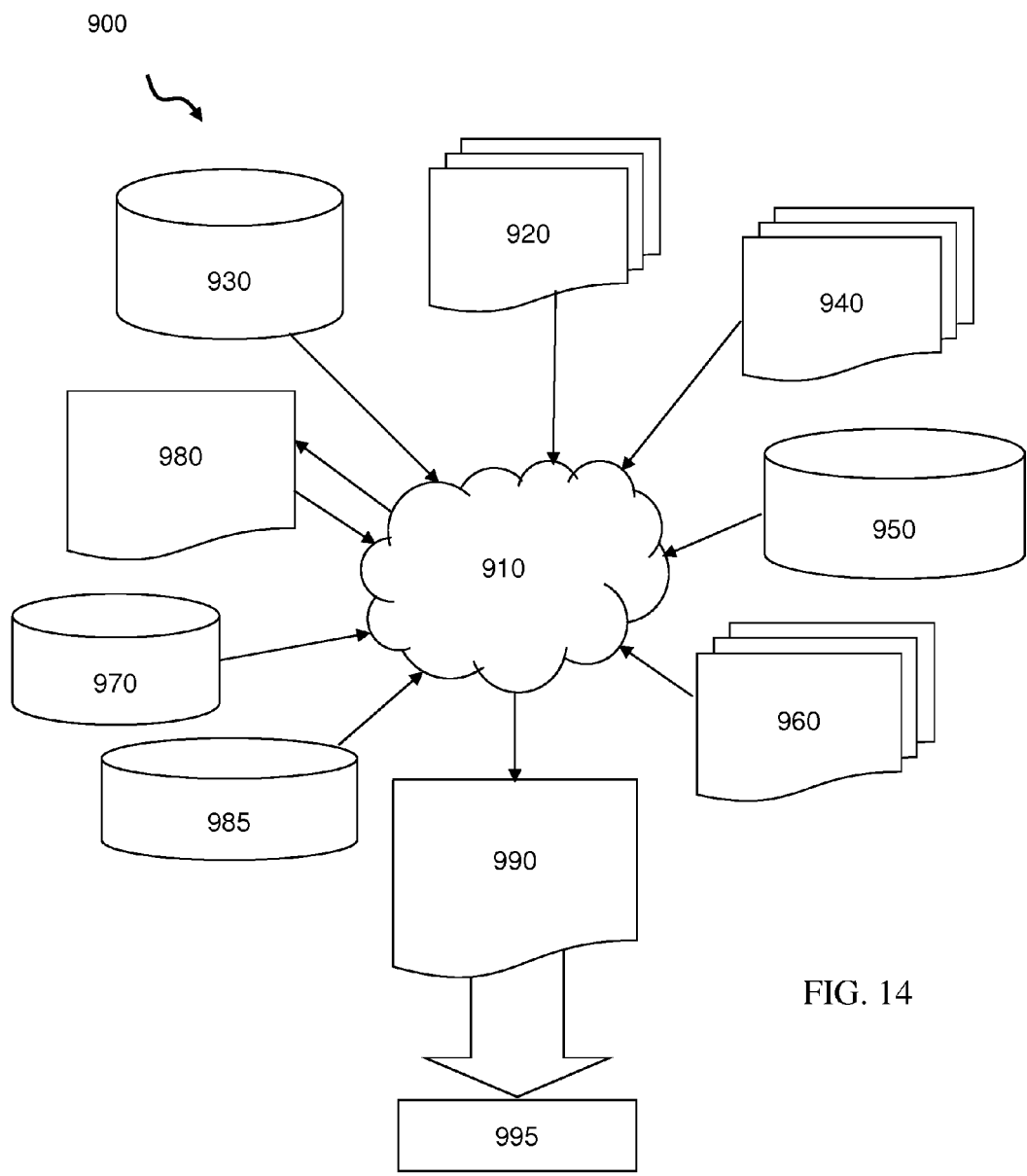
FIG. 14 is a flow diagram of a design process used in semiconductor design, manufacture, and/or test.

FIG. 14 is a flow diagram of a design process used in semiconductor design, manufacture, and/or test. FIG. 14 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-13. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-13. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-13 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-13. In one embodiment, design structure 990 may comprise a compiled, executable HDL simulation model that functionally simulates the devices shown in FIGS. 1-13.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-13. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of making a semiconductor structure, comprising:
    forming a shallow trench isolation (STI) structure in a substrate;
    forming a barrier layer on and contacting the STI structure and the substrate, wherein the barrier layer is composed of nitride or oxynitride;
    forming an insulator layer on and contacting the barrier layer;
    forming a trench through the STI structure and into the substrate;
    forming a liner comprising an electrical insulator material on sidewalls and a bottom of the of the trench;
    forming a core comprising a high thermal conductivity material in the trench and on the liner, wherein the liner is between the core and the substrate across the bottom of the trench; and
    forming a cap in the trench and on the core,
    wherein the forming the trench comprises:
        forming the trench with a first etch through the insulator layer, the barrier layer, and the STI structure using a photoresist as a mask;
        stripping the photoresist after the first etch; and
        after the stripping, extending the trench into the substrate with a second etch using the insulator layer as a mask.

2. The method of claim 1, further comprising recessing the core to form a second trench.

3. The method of claim 2, wherein the forming the cap comprises depositing a cap material in the second trench, and the liner contacts the insulator layer.

4. The method of claim 1, wherein the forming the trench comprises forming the trench adjacent to a heterojunction bipolar transistor (HBT) comprising a collector, a base formed over the collector, and an emitter formed over the base.

5. The method of claim 4, wherein the forming the core comprises forming a top surface of the core that is elevationally higher than an interface region between the collector and the base.

6. The method of claim 4, further comprising forming a contact through the cap and contacting the core.

7. The method of claim 6, further comprising forming a wire contacting the contact and providing a heat transfer path away from the core through the contact and the wire.

8. The method of claim 6, wherein the high thermal conductivity material comprises a phase change material.

9. The method of claim 6, further comprising forming electrical contacts to the collector, the base, and the emitter in an insulator layer over the HBT, wherein the contact and the electrical contacts are formed in a same process.

10. A method of making a semiconductor structure, comprising:
    forming first and second shallow trench isolation (STI) structures in a wafer comprising a substrate;
    forming a heterojunction bipolar transistor (HBT) comprising a collector, a base, and an emitter between the first and second STI structures;
    forming an insulator layer over the HBT and the first and second STI structures; and
    forming first and second trench isolation (TI) structures through the first and second STI structures, respectively, and into the substrate, wherein the first and second TI structures are each filled with an insulator liner and a core composed of high thermal conductivity material, and
    wherein the forming the HBT and the forming the insulator layer over the HBT and the first and second STI structures are both performed prior to the forming the first and second TI structures.

11. The method of claim 10, wherein the forming the first and second TI structures comprises:

forming first and second trenches extending through the insulator layer, the first and second STI structures, and into the substrate;

forming the insulator liner on sidewalls and entire bottom surfaces of the first and second trenches;

filling the first and second trenches with a core material comprising a high thermal conductivity material;

recessing the core material into the first and second trenches; and forming an insulator cap on the core material in the first and second trenches.

12. The method of claim 11, wherein the recessing the core material produces a top surface of the core material that is elevationally higher than an interface region between the collector and the base.

13. The method of claim 11, further comprising forming a contact through the insulator cap and contacting the core material.

14. The method of claim 13, further comprising forming a wire contacting the contact.

15. The method of claim 14, further comprising providing a heat transfer path away from the core material through the contact and the wire.

16. The method of claim 13, further comprising forming electrical contacts to the collector, the base, and the emitter in an insulator layer over the HBT, wherein the contact and the electrical contacts are formed in a same process.

17. The method of claim 10, wherein the insulator layer covers and contacts the HBT and the first and second STI structures, and the insulator layer contacts the insulator liner.

18. A method of making a semiconductor structure, comprising:

forming a transistor structure;

forming a plurality of shallow trench isolation structures adjacent to the transistor structure on multiple sides of the transistor structure; and forming a plurality of trench isolation structures through the plurality of shallow trench isolation structures, wherein each one of the plurality of trench isolation structures comprises:

a trench formed through an insulator layer, one of the plurality of shallow trench isolation structures, and into a substrate, wherein the insulator layer covers and contacts the transistor structure and the plurality of shallow trench isolation structures;

a liner comprising an insulator material on sidewalls of the trench, wherein the liner contacts the insulator layer, and the liner covers the sidewalls and an entire bottom surface of the trench;

a core comprising a high thermal conductivity material on the liner; and a cap in the trench over the core, wherein the cap, the insulator layer, and the liner comprise the insulator material.

* * * * *